(12) United States Patent
Masui et al.

(10) Patent No.: US 7,518,159 B2
(45) Date of Patent: Apr. 14, 2009

(54) PACKAGING TECHNIQUE FOR THE FABRICATION OF POLARIZED LIGHT EMITTING DIODES

(75) Inventors: Hisashi Masui, Santa Barbara, CA (US); Shuji Nakamura, Santa Barbara, CA (US); Steven P. DenBaars, Goleta, CA (US)

(73) Assignees: The Regents of the University of California, Oakland, CA (US); Japan Science and Technology Agency, Saitama Prefecture (JP)

( * ) Notice: Subject to any disclaimer, the term of this patent is extended or adjusted under 35 U.S.C. 154(b) by 0 days.

(21) Appl. No.: 11/472,186

(22) Filed: Jun. 21, 2006

(65) Prior Publication Data
US 2006/0284206 A1    Dec. 21, 2006

Related U.S. Application Data

(60) Provisional application No. 60/692,514, filed on Jun. 21, 2005.

(51) Int. Cl.
*H01L 29/22* (2006.01)
*H01L 33/00* (2006.01)
*H01L 21/00* (2006.01)

(52) U.S. Cl. .............. 257/98; 257/81; 257/91; 257/99; 438/25; 438/26

(58) Field of Classification Search .......... 257/79–103, 257/E33.003, E33.006; 438/22, 24, 25, 26, 438/27, 29
See application file for complete search history.

(56) References Cited

U.S. PATENT DOCUMENTS

| 6,072,197 | A | * | 6/2000 | Horino et al. | ............ 257/103 |
| 2003/0089899 | A1 | * | 5/2003 | Lieber et al. | ............ 257/9 |
| 2005/0205884 | A1 | | 9/2005 | Kim et al. | |

OTHER PUBLICATIONS

Gardner, N.F., "Polarization anisotropy in the electroluminescence of m-plane InGaN-GaN multiple-quantum-well light-emitting diodes," Appl. Phys. Lett. 86, pp. 111101-111101-3 (2005).
Rau, B. et al., "In-plane polarization anisotropy of the spontaneous emission of M-plane GaN/(Al,Ga)N quantum wells," Appl. Phys. Lett. 77, pp. 3343-3345 (2000).
Waltereit, P. et al., "Nitride semiconductors free of electrostatic fields for efficient white light-emitting diodes," Nature 406, pp. 865-868 (2000).

* cited by examiner

*Primary Examiner*—Hung Vu
(74) *Attorney, Agent, or Firm*—Gates & Cooper LLP

(57) ABSTRACT

A polarized light emitting diode (LED) includes a marker indicating a polarization direction. A package for the LED also includes a marker indicating the polarization direction. The markers on the LED and package are used for mutual alignment, wherein the LED is attached in a favorable orientation with respect to a package, so that the polarization direction of emitted light from the package is apparent. The marker is placed on the LED before die separation and the marker is placed on the package before alignment. The marker on the LED comprises a photolithographic pattern, an asymmetric die shape, a notch on the die, or a scratch on the die, while the marker on the package comprises an electrode shape or pattern, an asymmetric package shape, a notch on the package, or a scratch on the package. Finally, the LED or package may be installed in an external circuit or system that also indicates the polarization direction.

19 Claims, 8 Drawing Sheets

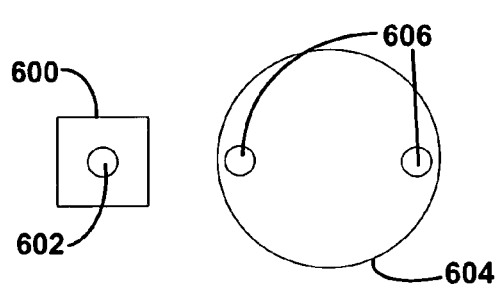
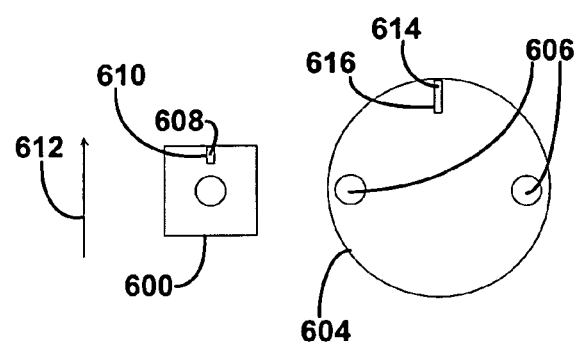
FIG. 6A  FIG. 6B
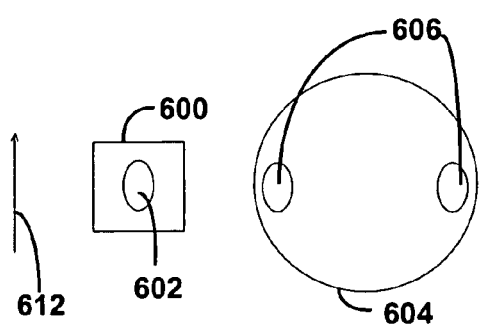
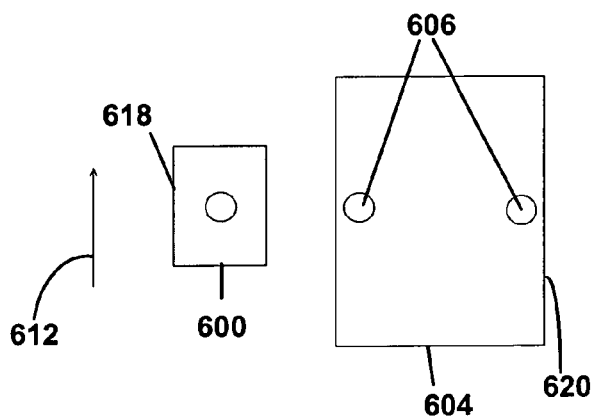
FIG. 6C  FIG. 6D

PACKAGING TECHNIQUE FOR THE FABRICATION OF POLARIZED LIGHT EMITTING DIODES

CROSS-REFERENCE TO RELATED APPLICATION

This application claims the benefit under 35 U.S.C. Section 119(e) of the following co-pending and commonly-assigned U.S. application:

U.S. Provisional Application Ser. No. 60/692,514, filed on Jun. 21, 2005, by Hisashi Masui, Shuji Nakamura and Steven P. DenBaars, entitled "PACKAGING TECHNIQUE FOR THE FABRICATION OF POLARIZED LIGHT EMITTING DIODES,"

which application is incorporated by reference herein.

BACKGROUND OF THE INVENTION

1. Field of the Invention

The present invention relates to a packaging technique for the fabrication of polarized light emitting diodes.

2. Description of the Related Art

Light emitting diodes (LEDs) have been used in the last thirty years as indicator lamps, local illuminators, and optical transmitters, among their many applications. In the last ten years, high-brightness AlInGaN-based blue and green LEDs have been developed for, and have started to emerge in, general lighting and full-color display applications.

In terms of LED fabrication, because of the incoherent and unpublicized light emission from conventional LEDs, it is not essential to define a particular die orientation of an LED package when the die is attached to the package. In common LED fabrication, die orientation is only significant when an LED wafer is diced, that is why LED photolithographic patterning onto a wafer is carried out by aligning the patterns along crystallographic directions. This alignment process makes die separation reliable and results in higher production yield.

In the case of AlInGaN LEDs prepared on an insulating substrate (for example, sapphire), where two electrical contacts are made on one side of an LED die, die orientation in relation to the package is significant in terms of position of the positive and negative metal contacts. These alignments for reliable die separation and electrical contacts are common practice for any semiconductor devices, not necessarily only in LED fabrication. However, LED die alignment has never been considered in fabrication in terms of emitted light properties.

Internal electrical polarization is a unique property of the (Al,In,Ga)N system compared to other semiconductors used in optoelectronics, and this property originates in the hexagonal crystallographic structure of the (Al,In,Ga)N material system. FIG. 1 is a schematic of a generic hexagonal wütrite crystal structure 100 and typical crystallographic planes of interest 102, 104, 106, 108 with principal crystallographic axes or directions 110, 112, 114, 116 identified therein, wherein the fill patterns are intended to illustrate the planes of interest 102, 104 and 106, but do not represent the materials of the structure 100.

Electrical polarization is created in the hexagonal structure due to its lack of inversion symmetry along the c-axis. For example, in the case of GaN shown in FIG. 2, along the c-axis gallium atoms (action, positively charged) and nitrogen atoms (anion, negatively charged) are positioned alternately and as a whole, electric neutrality is maintained. However, because of the lack of inversion symmetry there exists an internal electric field along the c-axis when the atoms are displaced from their ideal positions relative to each other along this axis. Since atoms in the AlInGaN system usually do not maintain their ideal positions, this polarization field almost always exists along the c-axis. For this reason, the c-plane is called a polar plane. Polarization fields do not exist along any of the a-axes or m-axes, due to the inversion symmetry along these particular axes. For this reason, a-planes and m-planes are called non-polar planes. For these planes, the polarization vector, which expresses direction and strength of polarization field, is parallel to the planes, since the net polarization vector is parallel to the c-axis.

AlInGaN materials are conventionally grown in the c-direction (direction along c-axis), and therefore on the c-plane. LEDs grown on the c-plane emit light with negligible light polarization. On this plane, the polarization field has no in-plane component and the isotropic mechanical stress within the c-plane in a quantum well (QW) structure of an LED does not change the nature of carrier recombination in the QW.

It has recently become possible to prepare AlInGaN LEDs on a-planes and m-planes. These LEDs exhibit linearly polarized light emission. The polarization field is in a particular direction (c-direction) in the plane, and the stress in the QW is anisotropic due to different degrees of lattice mismatch between the substrate and QW in the two perpendicular directions in the plane. The inventors have confirmed the emitted light from these non-polar LEDs is linearly polarized in a direction perpendicular to the c-axis.

Linearly polarized light is an electromagnetic wave that has its electric field only in one plane perpendicular to its propagation. Non-polarized light has its electric field evenly distributed in directions in planes perpendicular to its propagation. A principle application for polarized light is backlighting for liquid crystal displays (LCDs), in which LEDs are beneficial due to their compactness and energy efficiency compared to conventional cold cathode fluorescent tubes. (Al,In,Ga) N LEDs prepared on a semi-polar plane have also been confirmed to emit polarized light. The projection of the polarization vector, which is parallel to the c-axis, lies in the semi-polar plane, similar to the non-polar plane case.

What is needed in the art are simplified methods of fabricating polarized LEDs and packaging such LEDs. The present invention satisfies those needs.

SUMMARY OF THE INVENTION

The present invention describes at least one polarized light emitting diode (LED) including at least one marker indicating a light polarization direction. The LED may be attached in a favorable orientation with respect to a package, so that the light polarization direction of emitted light from the package is apparent. The package may include at least one additional marker indicating the light polarization direction.

The marker on the LED and the additional marker on the package are used for mutual alignment. The marker is placed or defined on the LED before die separation and the additional marker is placed or defined on the package before alignment. The marker on the LED comprises a photolithographic pattern, an electrode shape or pattern, an asymmetric die shape, a notch on the die, or a scratch on the die. The additional marker on the package comprises an electrode shape or pattern, an asymmetric package shape, a notch on the package, or a scratch on the package. LEDs may be installed in an array, external circuit or system that utilizes the light polarization, and the external circuit or system may have a similar marker.

The present invention also describes a method of fabricating at least one polarized light emitting diode (LED), comprising indicating a light polarization direction on the LED. The light polarization direction may be determined from knowledge of the crystallographic orientation of the LED. The method may comprise attaching the LED in a favorable orientation with respect to a package, so that the polarization direction of emitted light from the package is apparent. The method may further comprise indicating the light polarization direction on the package.

The indicating may comprise placement or definition of at least one marker on the LED and at least one additional marker on the package for mutual alignment. The method may comprise the placement or definition of at least one marker on each potential LED die before die separation and at least one additional marker defined or placed on each package before alignment. The marker on the LED may comprise a photolithographic pattern, an electrode shape or pattern, an asymmetric die shape, a notch on the die, or a scratch on the die. The additional marker on the package may comprise an electrode shape or pattern, an asymmetric package shape, a notch on the package, or a scratch on the package. The method may further comprise indicating the light polarization direction on an external circuit or system in which the LED is installed or matching the orientation of multiple LED dies.

The present invention also describes an LED having at least one orientation dependent emission characteristic including at least one marker indicating an orientation of the LED for which the orientation dependent characteristic is a maximum. A method for fabricating an LED with an orientation dependent emission characteristic is also disclosed.

BRIEF DESCRIPTION OF THE DRAWINGS

Referring now to the drawings in which like reference numbers represent corresponding parts throughout:

FIGS. 6A-6D are schematic top views of conventional and marked LED packages.

DETAILED DESCRIPTION OF THE INVENTION

Figure 1:
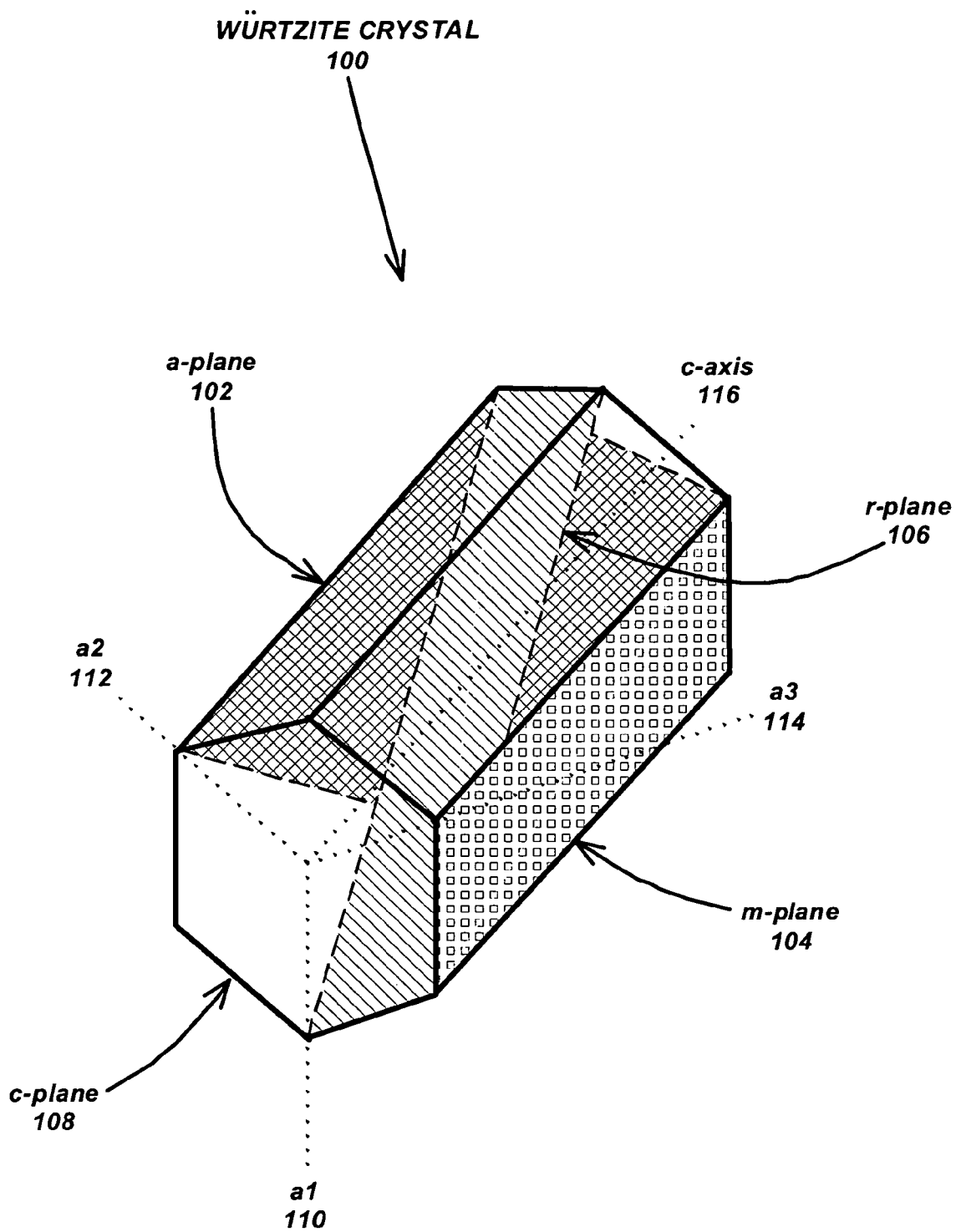
FIG. 1 is a schematic of a generic hexagonal crystal structure and crystal planes of interest.
Figure 2:
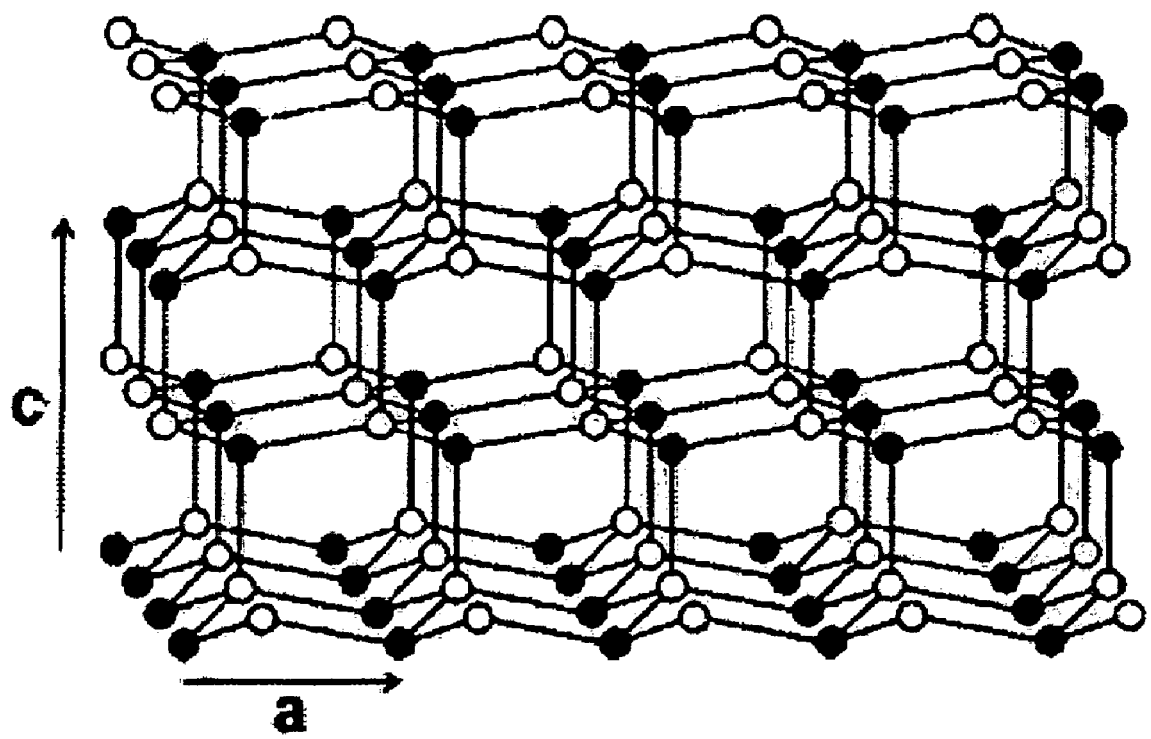
FIG. 2 illustrates the arrangement of atoms in a GaN crystal, wherein open circles are gallium and solid circles are nitrogen.

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

Polarized light emission has been experimentally confirmed from non-polar and semi-polar aluminum indium gallium nitride [(Al,In,Ga)N] based LEDs. While conventional LEDs only emit unpublicized light, polarized light emission is believed to be useful in certain applications, including, for example, backlighting for liquid crystal displays (LCDs).

In order to utilize the polarized light from the LEDs, it is important to keep track of the polarization direction until fabrication in an external system is completed. Unfortunately, the crystallographic orientation of individual LED device dies cannot be conveniently determined via optical observation.

To take the advantage of polarized light emission, the LED die must be attached in a favorable orientation with respect to the LED package, so that the polarization direction of the emitted light from the packaged device is apparent when the packaged device is handled and applied to an external system. This invention provides a simple and convenient means for consistently orienting polarized LEDs, LED packages, and external circuit components to which the polarized LEDs are applied.

Terminology

It is worthwhile here to clarify the terminology used in this disclosure, which is based on the convention of this particular research field of gallium nitride related materials. Electrical polarization and light polarization are both important concepts in this invention, but are different physical phenomena, although they both have been referred as "polarization". The electrical polarization relates to polarization vectors and internal polarization electric fields and is based on the crystallographic structure of a particular material system. In this case, the material is referred to as a "polar" material. If a material does not have internal electrical polarization, it is referred as a "non-polar" material. The light polarization relates to electromagnetic wave emission and the light is often referred as "polarized" light. The concept of light polarization is based on how electromagnetic waves propagate in space.

Crystallographic planes of polar materials that have a polarization vector normal to the plane are referred to as "polar" planes. Those that have a polarization vector parallel to the plane are referred as "non-polar" planes. Those that have a polarization vector at any other angle relative to the plane are referred as "semi-polar" planes. When this convention (polar, non-polar, or semi-polar) is applied to a device (for example, LEDs), it means the device is prepared on that (polar, non-polar, or semi-polar) crystal plane.

Technical Description

Figure 3:
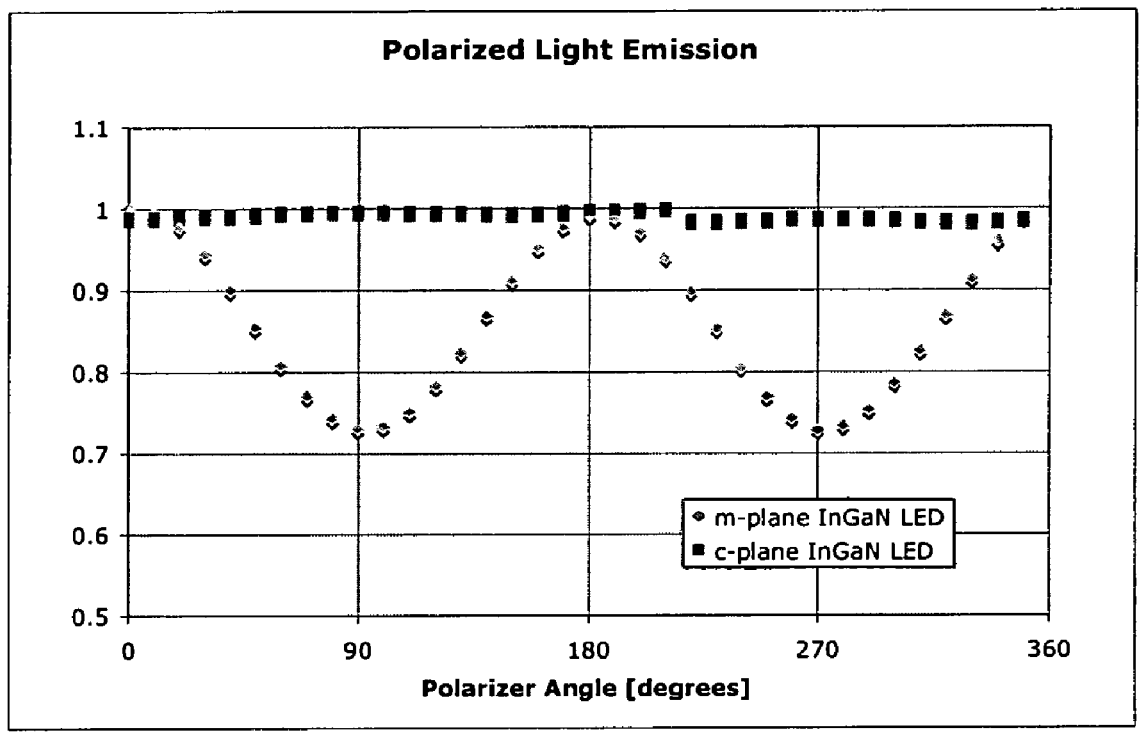
FIG. 3 is an illustration of the experimental results of polarized light emission from m-plane InGaN LEDs compared to negligible light polarization for c-plane LEDs.

Only recently was polarized light emission for LEDs experimentally confirmed. This is shown in FIG. 3, where comparison with a conventional c-plane InGaN LED is made. The c-plane LED demonstrates negligible polarization for the emitted light. The intensity of emitted light from m-plane InGaN LEDs becomes strong every 180 degrees of polarizer rotation, which is an indication of linearly polarized light. The intensity repetition does not occur by 90 degrees or any other angle. The light intensity is stronger in a particular direction in the m-plane InGaN LED, and that direction is defined by crystallographic direction of the LED die which is <11-20>, commonly called the a-direction. In this case, it becomes important to align the orientation of the LED dies (which determine the direction of polarization) and the direction of light utilization by an external system.

Figure 4:
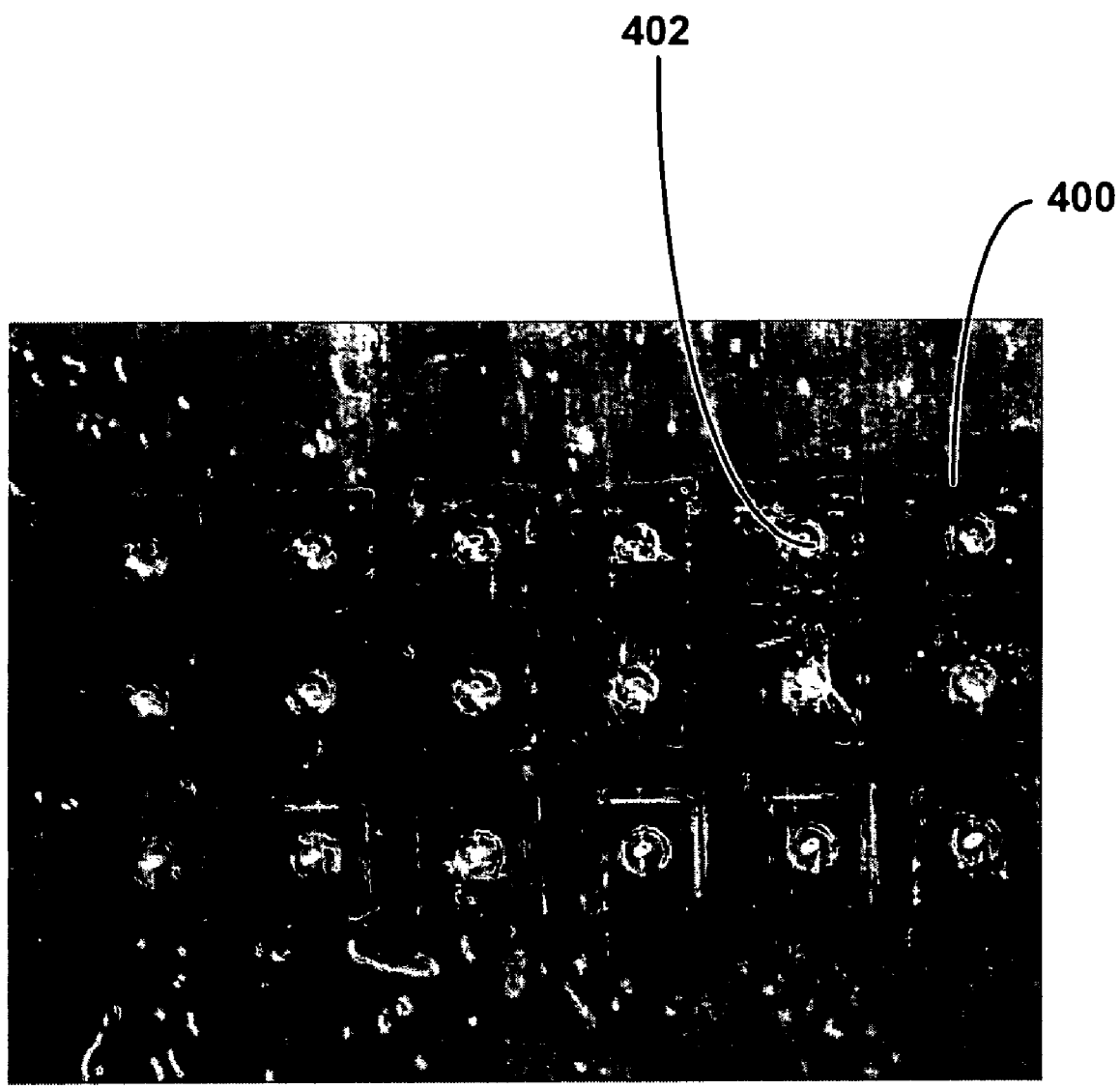
FIG. 4 are conventional LED dies manufactured by Cree Inc., comprising c-plane InGaN LEDs, and a die size of 300 μm ×300 μm.

Since conventional LEDs do not emit light that depends on die orientation, no attention is paid in application or fabrication in terms of light emission characteristics. FIG. 4 shows an example of such a case, a top view of conventional LED dies (400) with electrodes (402), which have square symmetry and therefore it is apparent that no caution is paid in production to die orientation.

Because of the necessity of mutual orientation alignment between an LED die, an LED package, and an external circuit or system such as a liquid crystal display that utilizes light polarization, it is advantageous to indicate the direction of light polarization explicitly. However, the crystallographic orientation of individual dies cannot be conveniently determined via optical observation. This invention accomplishes the tracking by a simple and convenient means that results in reliable and high-yield LED unit fabrication.

The present invention achieves the indication of the direction by putting a marker on each of the components for mutual alignment. The marker is readily visible by naked eye, by microscope observation, by an image recognition system, or by other means. As a result, the whole fabrication process of packaged LEDs, circuits or systems, becomes simple by eliminating a confirmation process of polarization direction by operating every LED die in production.

Figure 5:
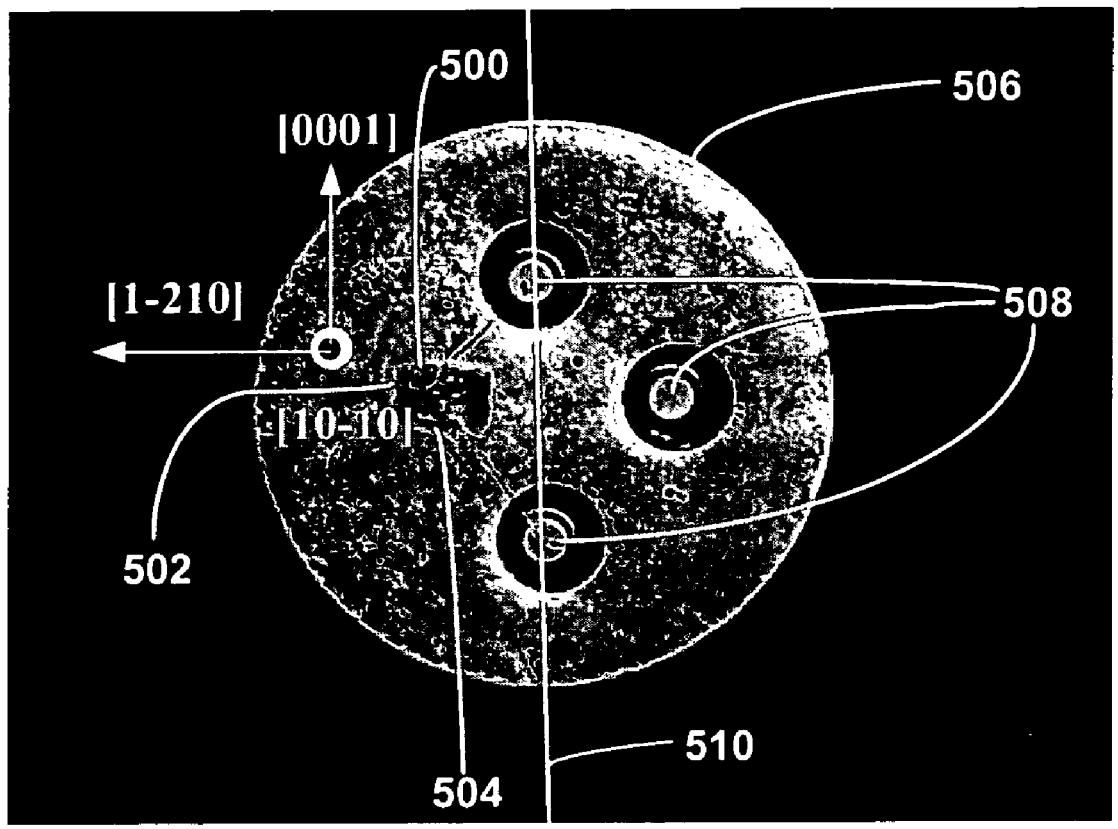
FIG. 5 is an example of a non-polar LED die having an orientation dependent emission characteristic mounted on a package.

FIG. 5 shows an embodiment for an LED with an orientation dependent emission characteristic including at least one marker indicating an orientation of the LED for which the orientation dependent emission characteristic is a maximum. In this figure the orientation dependent emission characteristic is light polarization and the LED is a polarized light emitting LED including a marker indicating a light polarization direction and a die (500) mutually aligned with a package (506). In this example, the rectangular shape of the m-plane InGaN LED die (500) indicates that the crystallographic c-axis <0001> is parallel to the shorter side (502) and the a-axis <11-20> is parallel to the longer side (504). Since the crystallographic direction (or orientation) indicates the polarization direction of emitted light, the rectangular shape is a marker of polarization direction. The header package (506) used in this example has three electrodes (508) embedded such that the rotational orientation of the package is explicit or apparent from observation of the electrodes. The LED die (500) may be attached to the package (506) in a favorable orientation with respect to the package, for example by aligning the longer side of the die marker (504) substantially parallel with the imaginary line (510) passing through two electrodes (508), so the polarization direction of emitted light from the package (506) is apparent because it is indicated by the two electrodes (508) aligned with the imaginary line (510). Thus, by defining and utilizing the rectangular die shape as a first marker and the electrodes (508) as an additional marker, the die installation can be performed by simple microscope observation and without operating the LED prior to the die-attach process to confirm the light polarization direction. Thus, by aligning the first marker and the additional marker, the die (500) and the package (506) are mutually aligned with the light polarization direction.

The inventors have experimentally confirmed polarized light emission from other AlInGaN LED crystallographic orientations or directions besides the m-plane, including the a-plane {11-20} and the {10-13} plane, which is a semi polar plane. LEDs grown on the a-plane {11-20} have been confirmed to emit light polarized in the m-direction <10-10>. LEDs grown on the semi polar plane {10-13} have been confirmed to emit light polarized in the a-direction <11-20>.

Based on these observations of polarized light emission, the present invention is also applicable to these LEDs and indeed to any LEDs grown on any plane other than the (0001) c-plane. Moreover, the light polarization does not depend on LED emission color. Therefore, the present invention is applicable to any color of LEDs, including blue, green, red, and white as long as an LED has orientation-dependent light emission characteristics.

Orientation Markers

The preferred embodiment of the present invention comprises the placement or definition of markers on LED dies before die separation and on packages before alignment, so that it will not be necessary to confirm the die orientation in terms of light polarization on every single die in fabrication. The marker on the LED dies can be a photolithographic pattern, an electrode shape or pattern, an asymmetric die shape, a notch or scratch on the die, etc. Similarly, the marker on the packages can be a part of metal electrode shape or pattern, an asymmetric package shape, a notch or scratch on the package, etc. External circuits or systems in which LED dies or packaged LEDs are installed can also have a similar marker, so the alignment relative to light polarization can be easily done in assembly, fabrication, or production without confirming the light polarization on every single LED die or packaged LED.

Examples of the above are shown in FIGS. 6A-6D, wherein FIG. 6A illustrates a conventional or prior art technique, and FIGS. 6B, 6C and 6D illustrate embodiments of the present invention.

FIG. 6A shows a prior art embodiment comprising an LED die (600), a circular electrode (602) on the LED, an LED package (604) with two electrodes (606) for electrically connecting to the LED.

In FIG. 6B, a marker (608) with an elongated side (610) parallel to the polarization direction (612) has been defined on the LED die (600). The LED package (604) has a marker (614) with a longer side (616). The LED die (600) may be attached to the package (604) in a favorable orientation with respect to the package, for example by aligning the longer side (610) of the die marker (608) parallel with the longer side (616) of the package marker (614), so the polarization direction (612) of emitted light from the LED is apparent or indicated because it is parallel to the longer side (616) which is clearly visible. In this way both the marker (608) and the longer side (616) are mutually aligned to the light polarization direction.

In FIG. 6C, the LED comprises an oval shaped feature or marker such as an electrode (602) with an elongation along the direction of polarized light (612). The LED package (604) also has oval electrodes (606) which are elongated and act as markers. The LED die (600) may be attached to the package (604) in a favorable orientation with respect to the package, for example by aligning the elongation of the oval electrode (602) parallel to the elongation of the package marker (606), so the light polarization direction (612) of emitted light from the LED is apparent or indicated because it is parallel to the elongation of the marker (606) which is clearly visible. In this way both the marker (602) and the package marker (606) are mutually aligned to the light polarization direction.

In FIG. 6D, the LED die marker comprises a rectangular shape of the die (600) with the longer side (618) parallel to the direction of polarized light (612). The LED package (604) comprises a rectangular shape with a longer side (620). The LED die (600) may be attached to the package (604) in a favorable orientation with respect to the package, for example by mutually aligning the longer side (618) of the die parallel to the longer side (620) of the package (604), so the polarization direction of emitted light from the LED is apparent or indicated because it is parallel to the longer side (620) which is clearly visible.

Fabrication Process Steps

Figure 7:
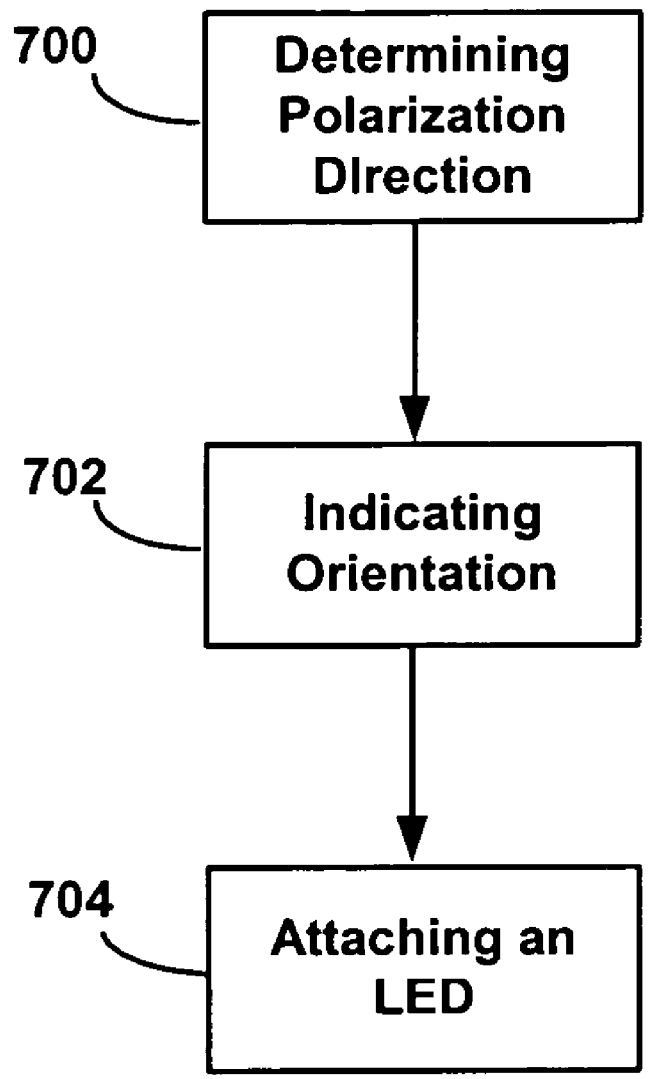
FIG. 7 illustrates a method for fabricating a polarized light emitting diode.

FIG. 7 illustrates a method for fabricating at least one polarized light emitting diode (LED), or at least one LED having at least one orientation dependent emission characteristic.

Block 700 represents the step of determining the polarization direction of light emitted from an LED from knowledge of the crystallographic direction of the LED. This step may comprise determining a crystallographic orientation direction of an LED wafer.

Block 702 represents the step of indicating the orientation of the LED for which the orientation dependent characteristic is a maximum. In the case of a polarized LED, this step comprises indicating a light polarization direction. The step may comprise indicating the light polarization direction on a package The indicating may comprise the placement or definition of at least one marker on the LED and at least one additional marker on the package for mutual alignment. The marker on the LED may comprise a photolithographic pattern, an electrode shape or pattern, an asymmetric die shape, a notch on the die, or a scratch on the die. The additional marker on the package may comprise an electrode shape or pattern, an asymmetric package shape, a notch on the package, or a scratch on the package. The step may further comprise indicating the light polarization direction on an external circuit or system in which the LED is installed. At least one marker may be placed or defined on each LED die before die separation and at least one additional marker may be defined or placed on each package before alignment, so that it will not be necessary to confirm the die orientation in terms of light polarization on every single die in fabrication.

Block 704 represents the step of attaching the LED in a favorable orientation with respect to a package or external system (such as a Liquid Crystal Display unit), so that the polarization direction of emitted light from the package or external system is apparent. This step may comprise mutually aligning the LED and the external circuit or system in which the LED is installed. The LED may be installed in an external circuit or system that utilizes the light polarization, and the external circuit or system has a similar marker for mutual alignment. The method may further comprise matching the orientation of multiple of the LED dies, or installing the multiple LEDs to form an array of the LEDs.

Steps may be added or omitted or may be performed in different order, as desired.

Possible Modifications and Variations

One possible modification of the present invention is a marker for other kinds of LED dies that do not necessarily emit polarized light, but that have orientation features in the dies, for example, surface textured LEDs. The inventors have been developing surface roughened LEDs, which yet have not shown orientation-dependent emission characteristics but there is a possibility to add orientation features onto these surface roughened LEDs. In this situation, a marker would be useful in production in the same manner.

So-called photonic crystals are under development and, in the near future, they will be integrated with LED dies. Those LEDs will have orientation-dependent emission characteristics such as intensity and markers will be useful in the same manner.

Markers could also be useful for LEDs grown on so-called epitaxial laterally overgrown (ELO) substrates. Other similar techniques include Facet-Initiated ELO (FIELO, NEC), Facet-Controlled ELO (FACELO, Mie University), Dislocation Elimination by Epitaxial growth with inverse-pyramidal Pits (DEEP, Sumitomo), Pendeoepitaxy (PENDEO, North Carolina State University, licensed by Nitronex), Cantilever Epitaxy (CE, Sandia), Lateral Overgrowth From Trenches (LOFT, Hewlett Packard), and Selective Area Lateral Epitaxy (SALE, University of South Carolina). All of these have micron-sized stripe features between the substrate and epitaxial layer. These LEDs may have orientation-dependent light emission intensity due to reflection or even diffraction from the stripe features. Because the stripes are typically transparent and difficult to see by naked eye, markers would be helpful to determine the die orientation in production.

An orientation dependent emission characteristic is a characteristic of the light emitted by the LED (such as intensity, polarization or some other characteristic) which depends on the orientation of the LED with respect to an axis perpendicular to the plane on which the LED is grown (typically c, m or a plane). A marker could be used to define or mark the orientation for which the characteristic is a maximum.

One particular application of the present invention is the backlighting of external systems such as Liquid Crystal Displays (LCDs). LCDs are a growing technology in flat panel displays and, since they are not self-emitting devices, they require a light source in the display unit. Most applications are now changing the light source from cold cathode fluorescent tubes to LEDs, and thus it is expected that this segment of the LED market will increase.

Figure 8:
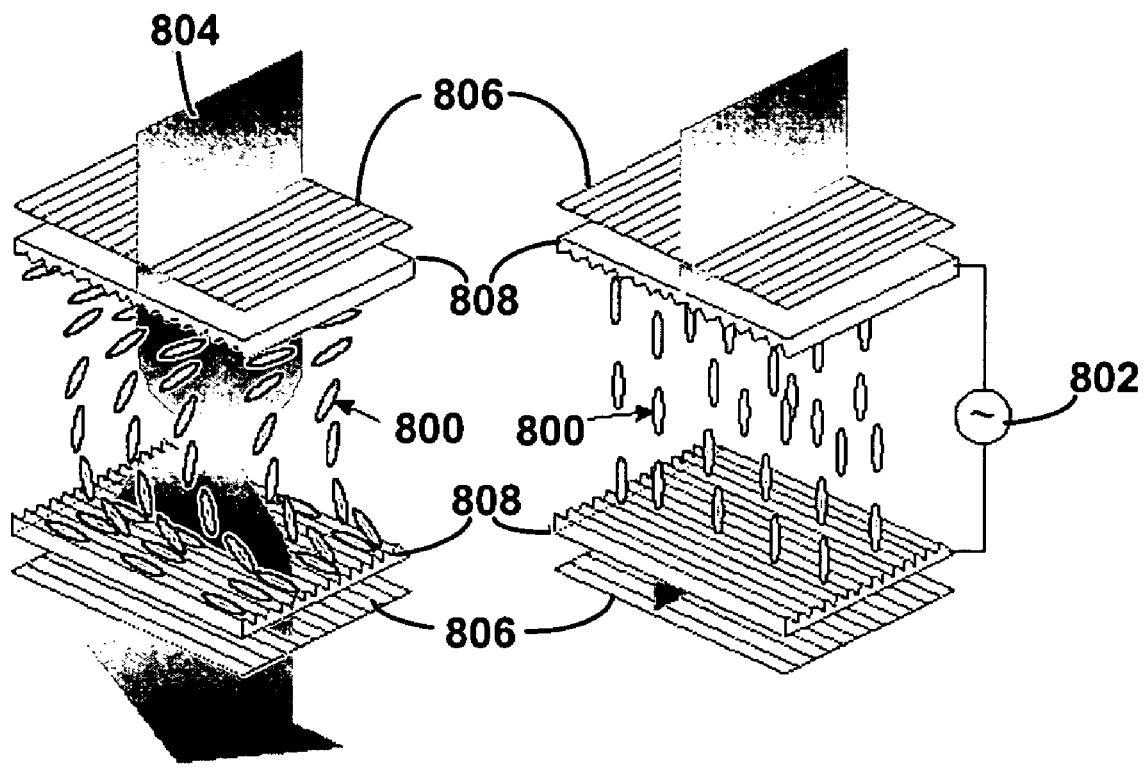
FIG. 8 illustrates the principles of LCD operation, wherein, in a conventional technique, polarized light is obtained after passing the first polarizer.

LCDs are based on light polarization technology, as shown in FIG. 8. A thin layer of liquid crystal works as an electrically controlled polarization rotator. When linearly polarized light is incident on a liquid crystal layer (800), the light can be passed though or blocked by electrically operating the liquid crystal by applying a voltage (802). What a LCD unit requires is a light source (804) combined with at least one linear polarizer (806), which is a plastic sheet to filter out unfavorably polarized components of the source light. The unit also comprises at least one alignment film (808). The polarizer (806) transmission is typically 80%, and therefore 20% is lost due to the polarizer. If a light source (804) comprising at least one polarized LED is applied to LCDs, the polarizer(s) (806) are no longer required, and display brightness is greatly increased. In addition, the weight of the display unit is decreased. A marker may be placed or defined on the LCD, so that the LCD and the polarized LED can be mutually aligned to the light polarization direction.

Regardless, if a LCD is large (as for a television screen) or small (as for a cell phone screen), multiple LEDs are used to obtain sufficient brightness. To use an LED array as a linearly polarized light source, the orientation of each die must match. To fabricate these LED arrays as polarized light sources, the marker technique of the present invention will make the whole production process simple and reliable, from die attachment into a package to final display unit assembling.

REFERENCES

The following references are incorporated by reference herein:

1. N. F. Garder, et al., "Polarization anisotropy in the electroluminescence of m-plane InGaN-GaN multiple-quantum-well light-emitting diodes," Appl. Phys. Lett. 86, 111101 (2005). This paper describes an experimental observation of polarized light emission, but does not discuss either LED packaging of the device or applications for the polarized light.

2. B. Rau, et al., "In-plane polarization anisotropy of the spontaneous emission of M-plane GaN/(Al,Ga)N quantum wells," Appl. Phys. Lett. 77, 3343 (2000) This paper describes light polarization from m-plane QWs by photoluminescence experiments. It does not show any electroluminescence or diode operation.

3. P. Waltereit, et al., "Nitride semiconductors free of electrostatic fields for efficient white light-emitting diodes," Nature 406, 865 (2000) This paper describes a possibility of high efficiency of luminescence from non-polar devices compared to polar devices.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, without fundamentally deviating from the essence of the present invention. It is intended that the scope of the invention be limited not by this detailed description, but rather by the claims appended hereto.

What is claimed is:

1. A polarized light emitting diode (LED) apparatus, comprising:
   at least one LED, for emitting polarized light, including at least one first marker indicating a light polarization direction of the LED; and
   a package, for containing the LED, including at least one second marker indicating a light polarization direction of the package;
   wherein the LED is positioned within the package by aligning the first marker with the second marker.

2. The polarized LED apparatus of claim 1, wherein the LED is attached in a favorable orientation with respect to the package, so that the light polarization direction of emitted light from the LED is apparent.

3. The polarized LED apparatus of claim 1, wherein the first marker on the LED and the second marker on the package are used for mutual alignment.

4. The polarized LED apparatus of claim 1, wherein the first marker is placed or defined on the LED before die separation and the second marker is placed or defined on the package before alignment.

5. The polarized LED apparatus of claim 1, wherein the first marker on the LED comprises a photolithographic pattern, an electrode shape or pattern, an asymmetric die shape, a notch on the die, ot a scratch on the die.

6. The polarized LED apparatus of claim 1, wherein the second marker on the package comprises an electrode shape or pattern, an asymmetric package shape, a notch on the package, or a scratch on the package.

7. The polarized LED apparatus of claim l, wherein the LED is installed in an external circuit or system that utilizes the light polarization, and the external circuit or system includes at least one third marker indicating a light polarization direction of the external circuit or system, wherein the package is positioned within the external circuit aligning the second marker with the third marker.

8. The polarized LED apparatus of claim 1, wherein the package contains an array of the polarized LEDs.

9. A method of fabricating a polarized light emitting diode (LED) apparatus, comprising:
   obtaining at least one LED, for emitting polarized light, including at least one first marker indicating a light polarization direction of the LED;
   obtaining a package, for containing the LED, including at least one second marker indicating a light polarization direction of the package; and
   positioning the LED within the package by aligning the first marker with the second marker.

10. The method of claim 9, wherein the light polarization direction is determined from the LED's crystallographic orientation.

11. The method of claim 9, wherein the LED is attached in a favorable orientation with respect to the package, so that the polarization direction of emitted light from the LED is apparent.

12. The method of claim 9, wherein the first marker on the LED and the second marker on the package are used for mutual alignment.

13. The method of claim 12, wherein the first marker is placed or defined on the LED before die separation and the second marker is placed or defined on each package before alignment.

14. The method of claim 12, wherein the first marker on the LED comprises a photolithographic pattern, an electrode shape or pattern, an asymmetric die shape, a notch on the die, or a scratch on the die.

15. The method of claim 12, wherein the second marker on the package comprises an electrode shape or pattern, an asymmetric package shape, a notch on the package, or a scratch on the package.

16. The method of claim 9, wherein the LED is installed in an external circuit or system that utilizes the light polarization, and the external circuit or system includes at least one third marker indicating a light polarization direction of the external circuit or system, wherein the package is positioned within the external circuit by aligning the second marker with the third marker.

17. The method of claim 9, wherein the package contains an array of the polarized LEDs.

18. A light emitting diode (LED) apparatus, comprising:
   at least one LED, having at least one orientation dependent emission characteristic, including at least one first marker indicating an orientation of the LED for which the orientation dependent emission characitinsoc is a maximum; and
   a package, for containing the LED, including at least one second marker indicating an orientation of the package for which the orientation dependent emission characteristic is a maximum;
   wherein the LED is positioned within the package by aligning the first marker with the second marker.

19. A method of fabricating at least one light emitting diode (LED) apparatus, comprising:
   obtaining at least one LED, having an orientation dependent emission characteristic, including at least one first marker indicating an orientation of the LED for which the orientation dependent characteristic is a maximum; and
   obtaining a package, for containing the LED, including at least one second marker indicating an orientation of the package for which the orientation dependent emission characteristic is a maximum;
   wherein the LED is positioned within the package by aligning the first marker with the second marker.

* * * * *

UNITED STATES PATENT AND TRADEMARK OFFICE
CERTIFICATE OF CORRECTION

PATENT NO. : 7,518,159 B2  Page 1 of 1
APPLICATION NO. : 11/472186
DATED : April 14, 2009
INVENTOR(S) : Masui et al.

It is certified that error appears in the above-identified patent and that said Letters Patent is hereby corrected as shown below:

Column 10

Claim 18, line 41, please delete "characitinsoc" and insert --characteristic--.

Signed and Sealed this

Fifth Day of October, 2010

David J. Kappos
*Director of the United States Patent and Trademark Office*